(12) United States Patent
Chapman

(10) Patent No.: US 6,272,108 B1
(45) Date of Patent: Aug. 7, 2001

(54) APPARATUS AND METHOD TO ALLOW A FRAME CHECK SEQUENCE TO DETERMINE THE UPDATING OF ADAPTIVE RECEIVER PARAMETERS OF A HIGH SPEED COMMUNICATION DEVICE

(75) Inventor: Joseph Quinn Chapman, Seminole, FL (US)

(73) Assignee: Paradyne Corporation, Largo, FL (US)

(*) Notice: Subject to any disclaimer, the term of this patent is extended or adjusted under 35 U.S.C. 154(b) by 0 days.

(21) Appl. No.: 09/021,850

(22) Filed: Feb. 11, 1998

Related U.S. Application Data

(60) Provisional application No. 60/036,006, filed on Mar. 5, 1997.

(51) Int. Cl.[7] .................................................... G01R 31/08
(52) U.S. Cl. ......................... 370/226; 370/242; 370/243; 370/246
(58) Field of Search ..................................... 370/226, 230, 370/242, 243, 246, 276, 279, 201, 270

(56) References Cited

U.S. PATENT DOCUMENTS

| | | | |
|---|---|---|---|
| 4,450,555 | * 5/1984 | Pays | 370/201 |
| 5,012,466 | * 4/1991 | Buhrke et al. | 370/270 |
| 5,983,271 | * 11/1999 | Alexander et al. | 709/227 |
| 6,100,835 | * 8/2000 | Hamilton | 341/155 |
| 6,134,237 | * 10/2000 | Brailean et al. | 370/394 |

\* cited by examiner

*Primary Examiner*—Wellington Chin
*Assistant Examiner*—Brenda Pham
(74) *Attorney, Agent, or Firm*—Scott A. Horstemeyer; Thomas, Kayden, Horstemeyer & Risley

(57) ABSTRACT

A DSL device performs a frame check sequence operation in a digital signal processor (DSP), i.e., layer one of the OSI seven layer model, heretofore performed only in layer two of the OSI seven layer model. Performing the layer two framing and calculating the frame check sequence in the DSP allows the DSP to use the layer two error detection results, and optionally, the mean squared error vector, to more accurately determine whether to update adaptive receiver parameters.

14 Claims, 7 Drawing Sheets

APPARATUS AND METHOD TO ALLOW A FRAME CHECK SEQUENCE TO DETERMINE THE UPDATING OF ADAPTIVE RECEIVER PARAMETERS OF A HIGH SPEED COMMUNICATION DEVICE

CROSS REFERENCE TO RELATED APPLICATION

This application claims priority to and the benefit of the filing date of co-pending and commonly assigned provisional application entitled THE FRAME CHECK SEQUENCE DETERMINES UPDATING A HIGH-SPEED MULTIPOINT MODEM'S EQUALIZER COEFFICIENTS, assigned Ser. No. 60/036,006, and filed Mar. 5, 1997, incorporated herein by reference.

FIELD OF THE INVENTION

The present invention relates generally to data communications, and more particularly, to a method and apparatus to determine the updating of a high speed communication device's adaptive receiver parameters.

BACKGROUND OF THE INVENTION

The field of data communications typically uses modems, or communication devices, to convey information from one location to another. Digital Subscriber Line (DSL) technology now enables communications devices to communicate large amounts of data. This communication scheme adheres generally to a model, known as the Open Systems Interconnect (OSI) Seven-Layer model. This model specifies the parameters and conditions under which information is formatted and transferred over a given communications network. A general background of the OSI seven layer model follows.

In 1978, a framework of international standards for computer network architecture known as OSI (Open Systems Interconnect) was developed. The OSI reference model of network architecture consists of seven layers. From the lowest to the highest, the layers are: (1) the physical layer; (2) the datalink layer; (3) the network layer; (4) the transport layer; (5) the session layer; (6) the presentation layer; and (7) the application layer. Each layer uses the layer below it to provide a service to the layer above it. The lower layers are implemented by lower level protocols which define the electrical and physical standards, perform the byte ordering of the data, and govern the transmission and error detection and correction of the bit stream. The higher layers are implemented by higher level protocols which deal with, inter alia, data formatting, terminal-to-computer dialogue, character sets, and sequencing of messages.

Layer 1, the physical layer, controls the direct host-to-host communication between the hardware of the end users' data terminal equipment (e.g., a modem connected to a PC).

Layer 2, the datalink layer, generally fragments the data to prepare it to be sent on the physical layer, receives acknowledgment frames, performs error checking, and re-transmits frames which have been incorrectly received.

Layer 3, the network layer, generally controls the routing of packets of data from the sender to the receiver via the datalink layer, and it is used by the transport layer. An example of the network layer is Internet Protocol (IP) which is the network layer for the TCP/IP protocol widely used on Ethernet networks. In contrast to the OSI seven-layer architecture, TCP/IP (Transmission Control Protocol over Internet Protocol) is a five-layer architecture which generally consists of the network layer and the transport layer protocols.

Layer 4, the transport layer, determines how the network layer should be used to provide a point-to-point, virtual, error-free connection so that the end point devices send and receive uncorrupted messages in the correct order. This layer establishes and dissolves connections between hosts. It is used by the session layer. TCP is an example of the transport layer.

Layer 5, the session layer, uses the transport layer and is used by the presentation layer. The session layer establishes a connection between processes on different hosts. It handles the creation of sessions between hosts as well as security issues.

Layer 6, the presentation layer, attempts to minimize the noticeability of differences between hosts and performs functions such as text compression and format and code conversion.

Layer 7, the application layer, is used by the presentation layer to provide the user with a localized representation of data which is independent of the format used on the network. The application layer is concerned with the user's view of the network and generally deals with resource allocation, network transparency and problem partitioning.

Existing digital subscriber line (DSL) devices operating in the full-duplex mode conduct equalizer training and coefficient determination using previously stored channel operating parameters determined by operations performed in the datalink layer (layer 2). For example, U.S. Pat. No. 4,621,366 discloses a modem that acquires, stores and reinitializes the modem equalizer using channel operating parameters determined during an initial training sequence. For a subsequent transmission, the modem uses the stored coefficients and parameters during a shortened training sequence. While this operation takes place in layer one of the OSI seven layer model, the aforementioned modem only uses the equalizer's mean-square-error vector to determine the probability of erroneous equalizer updating. Various channel conditions may cause the modem's equalizer to track inappropriately. By using only the modem's mean square error vector to determine the probability of erroneous equalizer updating, existing modems fail to take advantage of the layer two framing and frame check sequence available to a device's digital signal processor (DSP) in layer one of the OSI seven layer model.

In a multipoint communication environment including a control device and a plurality of remote devices, each device includes a transmitter and a receiver. Each device uses messages incorporating a protocol which includes the receiving device's address and a poll bit. The poll bit is set by the control device to indicate an expected response from a particular remote device. During an initial start up sequence, reception of a relatively long training sequence is necessary before data communication can proceed. The receiver parameters, including adaptive equalizer coefficients, for each remote device that has successfully completed the aforementioned lengthy training sequence are stored in a memory located within the control device. The control device will store the parameters for each remote device in a memory location dedicated to that particular remote device.

During subsequent transmissions, a relatively short training sequence, which synchronizes the control device receiver and identifies the transmitting remote device is used. During the reception of the subsequent message, parameters within the control device's equalizer, and other adaptive devices parameters, are adaptive and are modified to compensate for any changes in the channel characteristics.

Therefore, it would be desirable to provide a more robust technique for updating adaptive receiver parameters by allowing a DSP in a control device to use the layer two error detection results to decide whether the new adaptive parameters, available during the shortened training period, should be saved and used or discarded in favor of the last known good parameters.

SUMMARY OF THE INVENTION

In a communications channel using a DSL device, a standard training period is used to establish communication line parameters, which enable the devices to negotiate a clear communication path. Once the initial training period is complete, for example, once the devices have established a successful connection, the control device will periodically poll the remote devices in a half-duplex operating mode to determine whether any remote device has any information to send to the control device. Should the remote device have information to transmit, a shortened training period takes place.

During this shortened training period, the remote devices will transmit signals and the then current communication line parameters will be calculated by the control device, which enables the receiver in the control device to update various adaptive parameters including equalizer, adaptive gain control, timing loop, echo-canceler, and cross talk canceler parameters. During this shortened training period a frame check sequence is executed by the digital signal processor located in the control device. The results of the frame check sequence executed by the DSP in the control device will determine the quality of the newly calculated parameters.

While the foregoing is applicable to various adaptive receiver parameters, the following discussion will be with respect to the updating of a communication device's adaptive equalizer coefficients. It should be noted that the concepts of the present invention are applicable to other adaptive receiver parameters.

If the frame check sequence is error free, the receiver of the control device will update its adaptive parameters based upon the most recently calculated parameters. If the frame check sequence indicates an error in the transmission, the receiver of the control device will discard the newly calculated parameters and will instead load the last known good channel parameters into its adaptive devices and proceed with transmission. During this shortened training period the DSP uses the layer two error detection results to determine whether or not to save the new parameters. Optionally, the DSP may also use the mean-squared-error vector of the equalizer as additional input in determining whether or not to save the newly calculated parameters. This arrangement allows the DSP access to a more precise and robust channel parameter measurement in order to determine whether the user data contains errors prior to updating the adaptive equalizer coefficients. If this latest data contains errors, the device will not update the adaptive parameters, but will instead use the last known good parameters. If this latest data is error free, i.e., within the range of acceptable errors, the device will use this data to update the adaptive parameters.

The apparatus and method to allow a frame check sequence to determine the updating of adaptive receiver parameters of a high speed communication device can be embodied in a digital subscriber line (DSL) communication device, comprising a receiver for developing a received signal and a digital signal processor (DSP) configured to perform layer two error detection by computing a frame check sequence (FCS) on each frame of the received signal. The present invention also includes means for saving the adaptive parameters of an adaptive device located within the receiver of a control device, the adaptive parameters calculated by the DSP, if the frame check sequence indicates that the received signal is error free.

The present invention further includes means for using existing adaptive parameters of an adaptive device located within the receiver of the control device if the frame check sequence indicates that the received signal contains errors. This essentially allows the DSP to perform layer two framing and the frame check sequence in layer one, the physical layer, heretofore never performed by a DSP within a communication device.

The present invention can also be conceptualized as a method for re-establishing a connection in a digital subscriber line (DSL) communication device, comprising the steps of developing a received signal in a receiver and performing, in a digital signal processor (DSP), layer two error detection by computing a frame check sequence (FCS) on each frame of the received signal. The method also includes the step of saving the adaptive parameters of an adaptive device located within the receiver, the adaptive parameters calculated by the DSP, if the frame check sequence indicates that the received signal is error free. If the frame check sequence indicates that the received signal contains errors, the device uses existing parameters for all adaptive devices located within the receiver.

The invention has numerous advantages, a few of which are delineated hereafter, as merely examples.

An advantage of the present invention is that it allows a communication device (or a DSP in a communication device) to perform OSI layer two frame check sequencing and error correction. This results in an increased level of error detection because the DSP now has access to the layer two error correction framing information in addition to the mean-square-error vector of the equalizer.

Another advantage of the present invention is that it provides a more robust, better performing technique for updating the adaptive receiver parameters.

Another advantage of the present invention is that it allows the equalizer filter taps to adjust gracefully to changing line conditions.

Another advantage of the present invention is that it allows for error correction in an uncoded modulation environment.

Another advantage of the present invention is that it is simple in design, reliable in operation, and its design lends itself to economical mass production in DSL devices.

Other objects, features, and advantages of the present invention will become apparent to one with skill in the art upon examination of the following drawings and detailed description. It is intended that all such additional objects, features, and advantages be included herein within the scope of the present invention, as defined in the appended claims.

BRIEF DESCRIPTION OF THE DRAWINGS

The present invention, as defined in the claims, can be better understood with reference to the following drawings. The drawings are not necessarily to scale, emphasis instead being placed on clearly illustrating the principles of the present invention.

DETAILED DESCRIPTION OF THE PREFERRED EMBODIMENT

The apparatus and method to allow a frame check sequence to determine the updating of adaptive receiver parameters of a high speed communication device can be implemented in software, hardware, or a combination thereof. In the preferred embodiment, the elements of the present invention are implemented in software that is stored in a memory and that configures and drives a suitable digital signal processor (DSP) situated in a communication device. However, the foregoing software can be stored on any computer-readable medium for transport or for use by or in connection with any suitable computer-related system or method. In the context of this document, a computer-readable medium is an electronic, magnetic, optical, or other physical device or means that can contain or store a computer program for use by or in connection with a computer-related system or method. Furthermore, the present invention is applicable to all modulation schemes as known in the art, and while discussed in the preferred embodiment as useful for updating the adaptive coefficients of an adaptive equalizer, the present invention is useful for updating any adaptive receiver parameter. For example, but not limited to the invention can be used to update, adaptive gain control, timing loop, echo-canceler, and cross talk canceler parameters.

Figure 1:
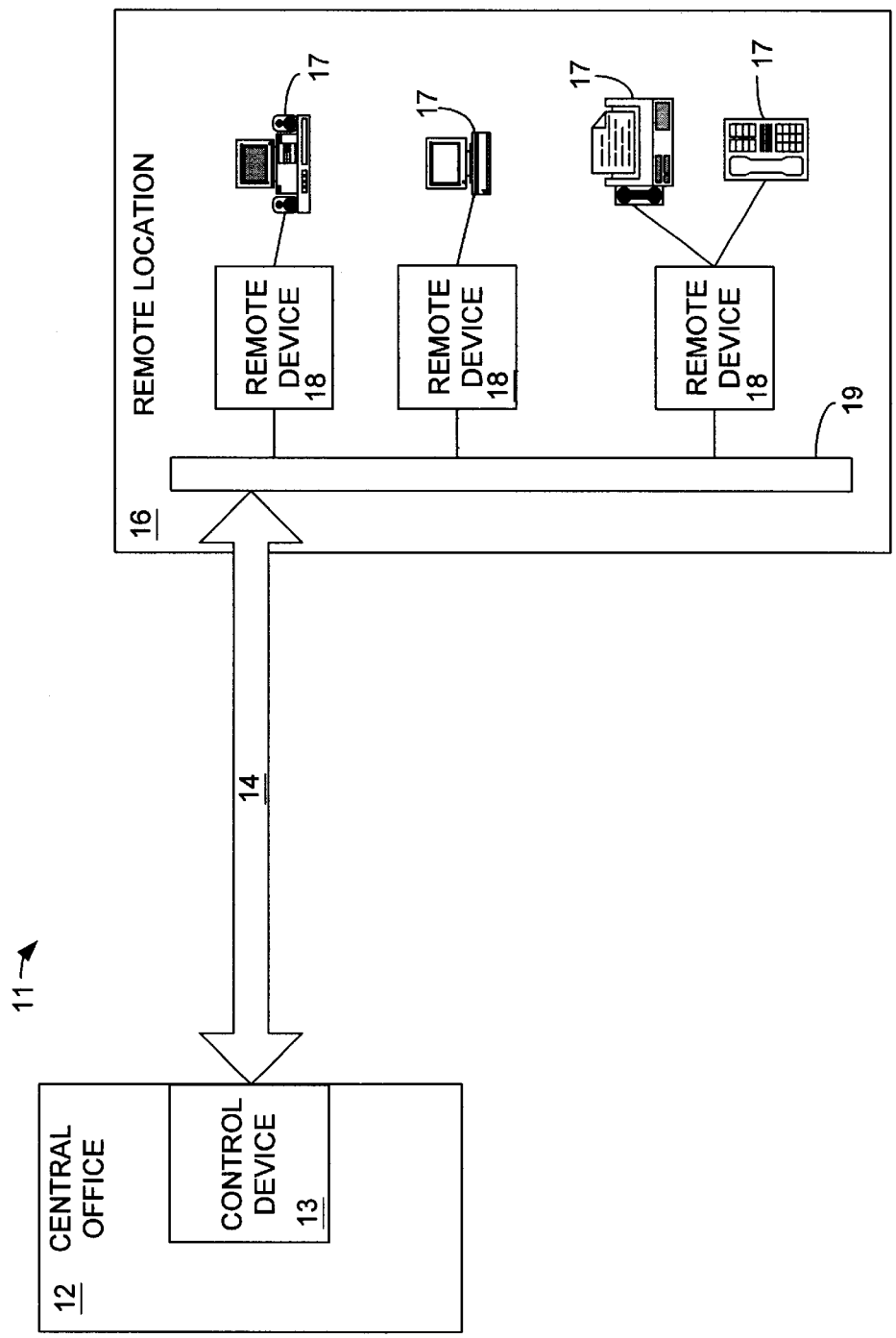
FIG. 1 is a schematic view illustrating a multipoint communications environment in which communication devices including the frame check sequence and adaptive parameter update logic operate.

FIG. 1, shows a schematic view illustrating a multipoint communications environment 11 in which communication devices employing the frame check sequence and adaptive parameter update logic of the present invention operate. Remote location 16 is connected to central office location 12 via communication channel 14. In the preferred embodiment, control device 13 and remote device 18 are illustratively digital subscriber line (DSL) communication devices. However, the concepts of the present invention are applicable to various other types of communication devices employing adaptive parameters.

Located at central office location 12 is control device 13. Communication channel 14 is typically the copper wire pair that extends between a telephone company central office and a remote residential, business, or any other location served by local telephone service. Remote location 16 may contain a plurality of remote devices 18 connecting a plurality of user devices 17 to communication channel 14 via communication bus 19. Communication bus 19 is illustratively the copper wiring infrastructure used throughout a remote location to connect remote devices 18 to communication channel 14. Remote devices 18 are typically located in a residential or business location.

Furthermore, all of the functionality described herein occurs in layer 1, the physical layer, of the OSI seven layer model, i.e., is performed by the communication device or a DSP within a communication device.

Architecture

Figure 2:
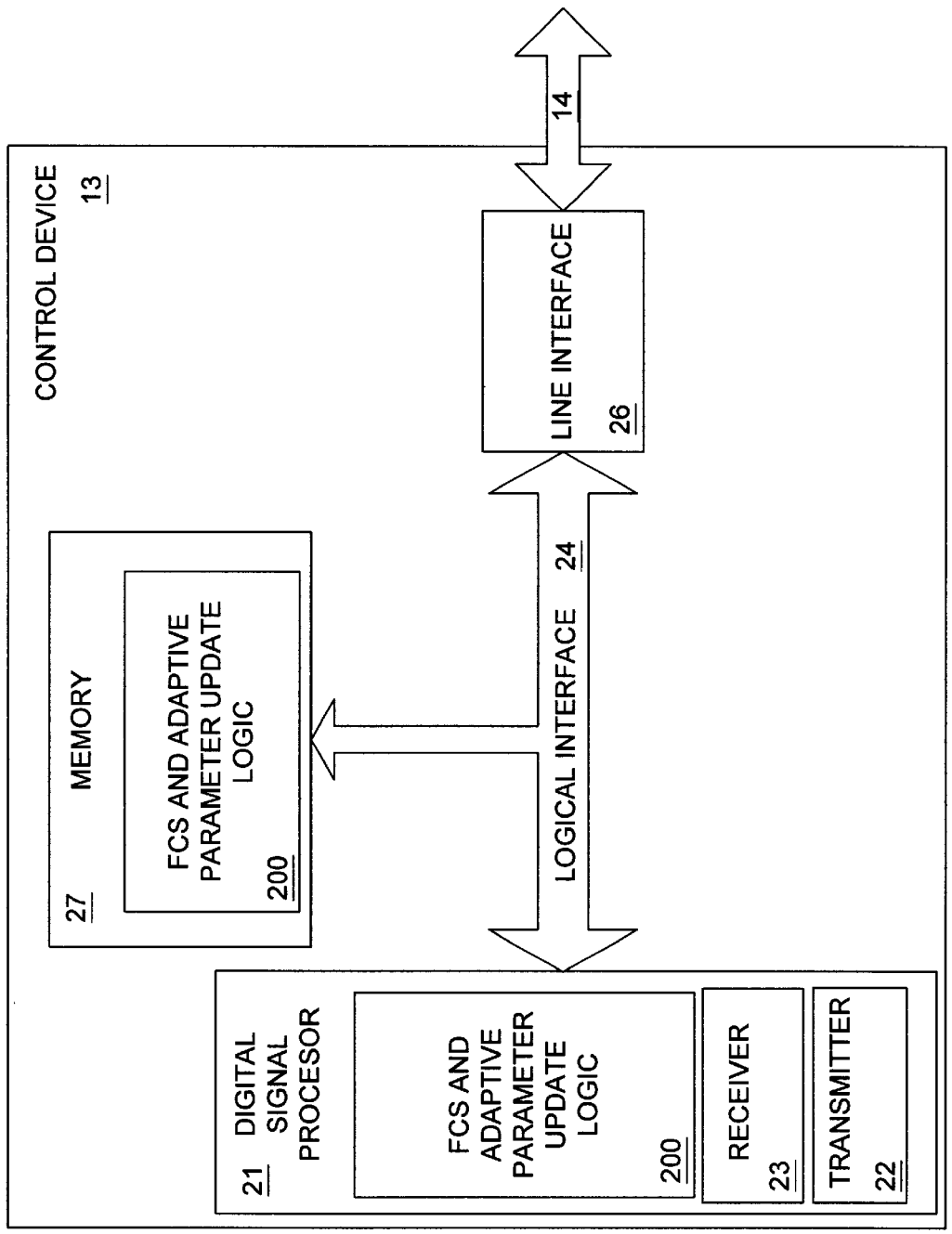
FIG. 2 is a block diagram of a communications device including the frame check sequence and adaptive parameter update logic of the present invention.

Now referring to FIG. 2, shown is a schematic view illustrating control device 13 of FIG. 1 including the frame check sequence and adaptive parameter update logic 200 of the present invention. Typically, control device 13 will transmit signals to remote devices 18 over communications channel 14. Similarly remote devices 18 will transmit signals to control device 13.

Control device 13 contains frame check sequence (FCS) and adaptive parameter update logic 200 which enables the control device to perform a frame check sequence in the digital signal processor (OSI layer one) using information available in the data link layer (OSI layer two) to determine whether to update adaptive parameters using newly calculated channel parameters, or whether to discard the new parameters and use last known good saved parameters.

Still referring to FIG. 2, control device 13 contains conventional components as is known in the art of data communications. Digital Signal Processor (DSP) 21 controls the operation of, and includes, control device's transmitter 22 and receiver 23, and couples to line interface 26 to gain access to communications channel 14. Also included in DSP 21 of control device 13 is FCS and adaptive parameter update logic 200, which enables control device 18 to more reliably and robustly perform error detection. Also contained within control device 13 is memory 27, which also includes FCS and adaptive parameter update logic 200. In a preferred embodiment, the logic of the present invention is executed within DSP 21 and is therefore shown as residing in both memory 27 and in DSP 21. While depicted as discrete components, control device 13 may illustratively be contained within DSP 21, i.e., DSP 21 can perform all the functionality of control device 13.

Prior to discussing the present invention, the general operation of a communication device employing the FCS and adaptive parameter update logic 200 of the present invention will be discussed. While the preferred embodiment is discussed with respect to circular signal space constellations and carrierless amplitude/phase (CAP) modulation, the concepts of the present invention are applicable to all modulation schemes and all signal space constellation configurations.

Figure 3:
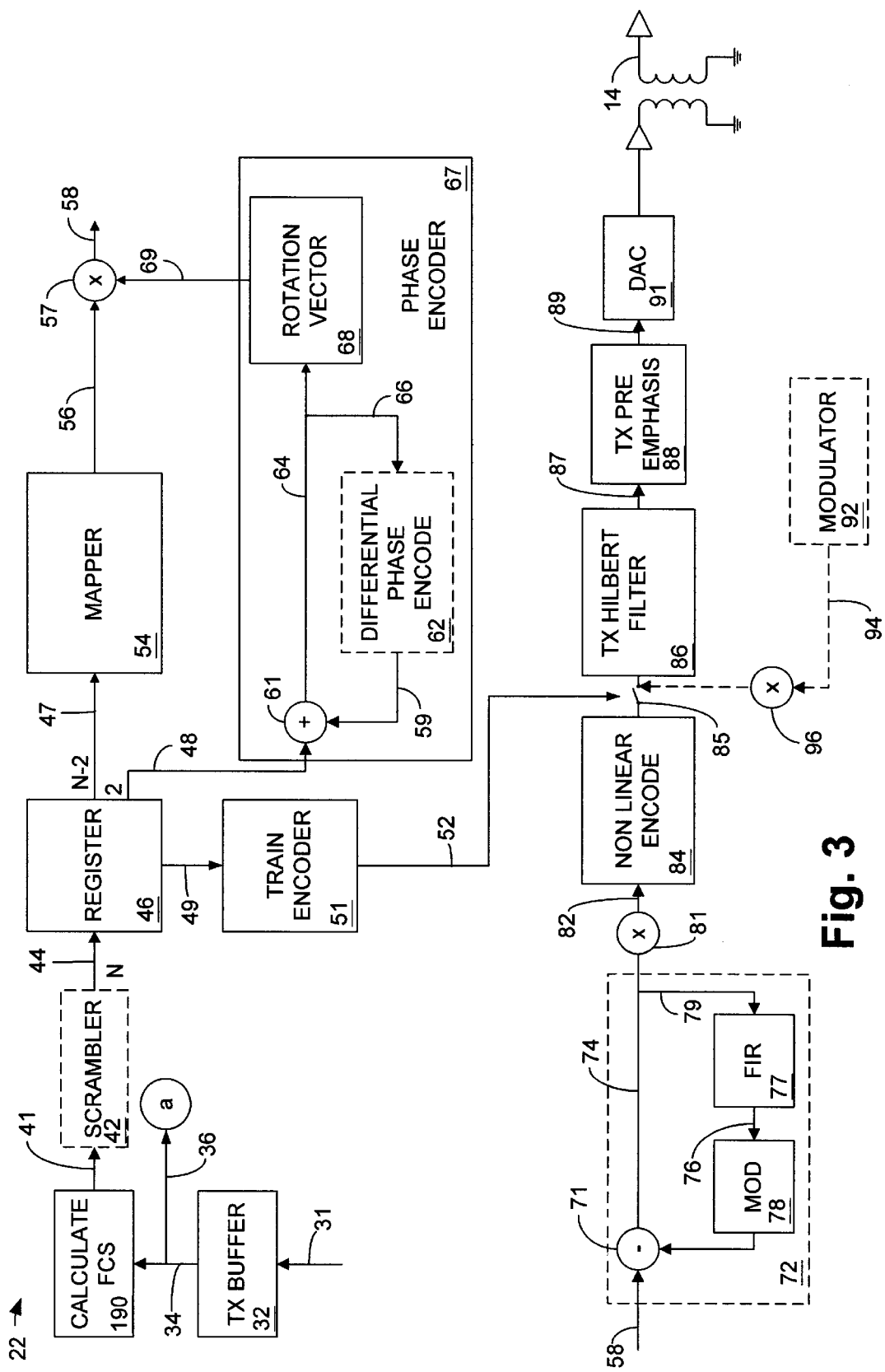
FIG. 3 is a schematic view illustrating a transmitter of the communication device of FIG. 2.

With reference to FIG. 3, shown is a preferred embodiment of a transmitter 22 of modem 13 employing the FCS and adaptive parameter update logic 200 of the present invention. Illustratively, an ISA bus, a standard computer bus which eliminates the need for interfaces, supplies data, in the form of a data word that can be either 16 or 32 bits for the preferred embodiment, on line 31 to tx buffer 32. Tx buffer 32 outputs a signal representative of information to be transmitted on line 34. The information signal, or N bit word on line 34 includes the setting of a poll bit, which indicates to each remote device that a communication is starting. The use of the poll bit will be described herein in detail with reference to FIGS. 4A, 5 and 6. The N bit word on line 34 next has its frame check sequence (FCS) calculated 190 in DSP 21 and in accordance with the present invention.

Optionally, the N bit word is next input on line 41 to scrambler 42. Scrambler 42 can be either a self synchronized scrambler or a preset free running scrambler as is known in the art. Depending on the application, the preset scrambler may have some advantage, as in the case of using Reed-Solomon coding. If scrambler 42 is employed, a scrambled N bit word is output on line 44. The scrambled N bit word is then sent on line 44 to register 46. This data word is transformed into an N bit word by counting bits and shifting to arrive at a smaller number of bits, in this example, an N bit data word is segmented into N-2 most significant bits (msb's) and 2 least significant bits (lsb's). By employing a circular signal space constellation, N can be any number.

Optionally, in order to allow the transmission of fractional bit rates as is known in the art of data communications, register 46 can include a modulus converter or other means such as constellation switching or shell mapping. Modulus conversion is a well known technique in the art of communications for allowing the transmission of fractional bit rates, and is described in U.S. Pat. No. 5,103,227. Constellation switching allows the transmission of fractional bit rates by, for example, first transmitting 6 bits in one symbol and 7 bits in the next symbol if it is desired to transmit 6½ bits. For 6¾ bits one would transmit 7 bits per symbol for three symbol cycles and transmit 6 bits per symbol for the fourth symbol cycle. Shell mapping blocks the data into frames and a shell mapping algorithm, such as that described in the V.34 specification, is used to map the frames of data into a constellation of a certain size The resulting N-2 bit word on line 47 is supplied to mapper 54 which maps the N-2 bit word, in this preferred embodiment, into a multidimensional circular signal space constellation, resulting in mapped N-2 msb's, represented by a 2-dimensional vector, supplied on line 56 to rotator 57. Other signal space constellations may be used while employing the concepts of the present invention.

Next, the 2 lsb's on line 48 are operated upon by phase encoder 67. Phase encoder 67 is designed to develop a rotation vector 68 using the 2 lsb's supplied by the register. This rotation vector is output on line 69 and combined in rotator 57 with the mapped N-2 bit word on line 56 to form a phase rotated signal, thus creating a symmetric circular signal space constellation. Optionally, phase encoder 67 includes differential phase encoder 62 which encodes the 2 lsb's of the N bit word to develop 2 differential bits. These 2 differential bits are output on line 59 and combined with the 2 lsb's from register 46 in adder 61 and become part of the rotation vector 68.

Rotator 57 performs vector multiplication on the rotation vector on line 69 and the mapped N-2 msb's on line 56 to cause a phase rotation, thus producing the final quadrant symmetric circular signal space constellation on line 58.

The circular constellation on line 58 is then supplied to precoder 72. Precoder 72 comprises a finite impulse response (FIR) filter 77 in feedback loop 79. While a FIR filter is illustrated, any filter can be employed. FIR filter 77 is followed by modulo operation 78. Modulo operation 78 operates on the signal on line 76 whereby if the voltage of the signal on line 76 is greater than a preset value, twice that value is subtracted from the signal until the signal is less than or equal to the preset value. Or, if a value more negative than a negative preset value, twice that value is added to the signal until the signal is greater than or equal to the negative preset value. The modulo modified signal is then supplied to subtractor 71 where it is subtracted from the signal on line 58 for input to FIR filter 77. After processing by precoder 72 the circular constellation is supplied on line 74 to scaler 81.

Scaler 81 multiplies the circular constellation by a scale function of the data rate and supplies a complex number comprising X and Y values on line 82 to nonlinear encoder 84. The scale function allows a single table to be used to implement the mapper at all data rates. Nonlinear encoder 84 encodes the signal as described in commonly assigned U.S. Pat. No. 5,265,127 to Betts et al. titled "NON-LINEAR ENCODER AND DECODER FOR INFORMATION TRANSMISSION THROUGH NON-LINEAR CHANNELS" dated Nov. 23, 1993.

The encoded signal output from nonlinear encoder 84 is next supplied through baud timing switch 85 to TX Hilbert filter 86. Baud switch 85 is controlled by train encoder function 51 via line 52. TX Hilbert filter 86 operates on the signal to provide a carrierless amplitude/phase modulation (CAP) modulated signal on line 87 to transmit pre emphasis filter 88. Alternatively, the scaled circular constellation supplied through switch 85 can be modulated using modulator 92, using a technique such as discrete multitone modulation (DMT), or coded or uncoded quadrature amplitude modulation (QAM). Modulator 92 provides the sine and cosine components of a carrier frequency, or the X and Y values of the carrier frequency as is known in the art, on line 94 to multiplier 96. Multiplier 96 combines the X and Y components with the output of nonlinear encoder 84 for input to TX Hilbert filter 86 which provides a bandpass output at a certain frequency range. The concepts and features of the present invention as claimed can be practiced using various modulation schemes, such as CAP modulation, DMT modulation, or a coded or uncoded modulation technique such as QAM or PAM. All modulation schemes are contemplated by the present invention.

The operation of the communications system disclosed thus far, i.e., up to TX Hilbert filter 86, occurs at the symbol rate of the modem, with the symbol rate equal to the bandwidth of the modem, thus allowing the use of reduced cost components. The output of TX Hilbert filter 86, transmit pre emphasis filter 88 and DAC 91 are computed at the sample rate, which is typically three times that of the symbol rate.

The modulated signal on line 87 is supplied to transmit pre emphasis filter 88. As is known in the art, transmit pre emphasis filter 88 adds pre emphasis to the signal, and is typically a FIR filter as is known in the art. The pre emphasized transmit signal is next supplied on line 89 to digital to analog converter 91 for conversion to an analog signal that can be transmitted conventionally over communication channel 14 as is known in the art. Optionally, pre emphasis filter 88 can reside after the DAC to provide pre emphasis in the analog domain.

Figure 4A:
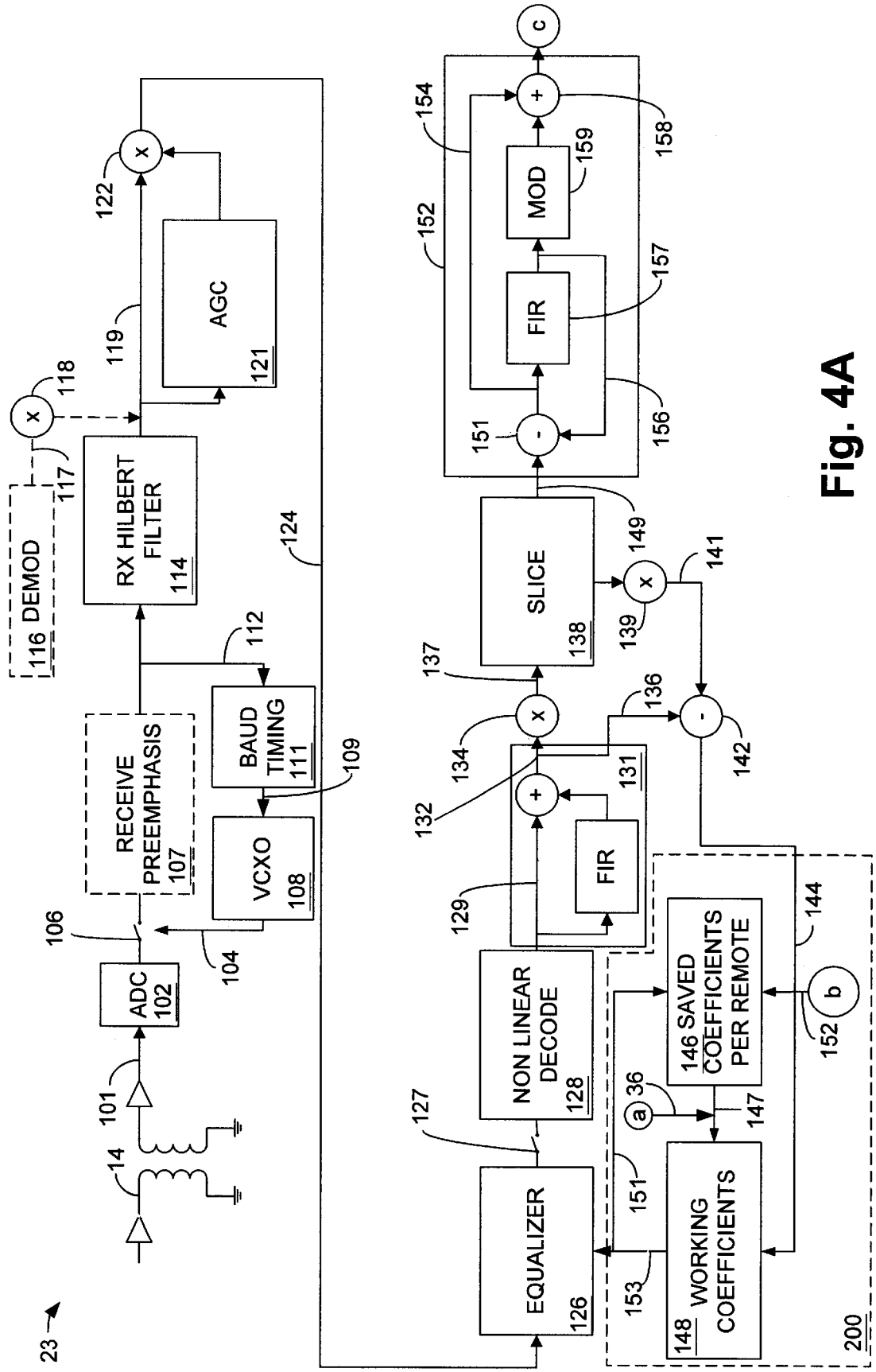
FIGS. 4A and 4B collectively illustrate a schematic view of the receiver of the communication device of FIG. 2.

Now referring to FIG. 4A, shown is a schematic view of the receiver section 23 of the communication device of FIG. 2.

The received signal is input from communication channel 14 on line 101 to analog to digital converter 102 for conversion to the digital domain as known in the art. The digital received signal is supplied through baud timing switch 106 to RX Hilbert filter 114. The filtered signal is output from RX Hilbert filter 114 on line 119. In the case of QAM modulation, demodulator 116 provides the sine and cosine components of the carrier frequency on line 117 to multiplier 118 for combination with the output of RX Hilbert filter 114. Furthermore, other demodulation techniques, such as DMT or PAM, can be used. The demodulated output is provided on line 119 to adaptive gain control (AGC) circuit 121. AGC circuit 121 multiplies the demodulated received signal by gain factor 122. The AGC compensated signal is then supplied on line 124 to equalizer 126. Equalizer 126 is a known in the art finite impulse response (FIR) filter with adaptive parameters, the adaptive parameters being updated in accordance with the FCS and adaptive parameter update logic 200 of the present invention to be discussed hereafter.

Optionally, receive pre emphasis 107 may be employed to further enhance the communication signal. This is particularly advantageous when an echo canceler is used where a replica of the transmit echo is subtracted from the input to the RX Hilbert filter 114 at the output of the receive pre emphasis filter 107.

Baud timing switch 106 and baud timing switch 85 of FIG. 3 are controlled by a timing signal supplied on line 104 from voltage controlled crystal oscillator (VCXO) 108. VCXO 108 receives its input signal on line 109 from baud timing device 111, which operates on the received signal output from receive pre emphasis 107, if employed, and from ADC 102 if receive pre emphasis is omitted. Baud timing device 111 develops a timing signal used to drive VCXO 108, which in turn drives baud timing switches 106 and 85.

The coefficients of equalizer 126 are adaptively updated by subtracting the input of scaler 134 from the ideal reference signal output of slicer 138, which is upscaled by scaler 139 and output on line 141. The output of subtractor 142 is the error signal that is supplied via line 144 to register 148. Register 148 contains the last known good equalizer working coefficients calculated by DSP 21 based upon the message sent by remote device 18 to control device 13, and supplies these working coefficients to equalizer 126 via line 153 during the time that control device 13 is polling remote device 18. Specifically, control device 13 recalls the last known good equalizer coefficients each time it sends a query to remote device 18.

When remote device 18 responds to the poll, the signal from remote device 18 contains new channel parameters. In accordance with the present invention, at this time, FCS and adaptive parameter update logic 200 located in DSP 21 and illustrated as block diagram components 146 and 148 of FIG. 4A, and components 190 and 196 of FIG. 4B, calculates the frame check sequence (to be discussed in detail with respect to FIG. 5) in order to determine whether the most recently received signal contains errors. If the transmission from remote device 18 is error free, the most recently calculated coefficients 146 sent on line 152 are saved and used to update equalizer 126 via line 151. These coefficients will be recalled by control device 13 the next time a transmission takes place. If the most recently received signal contains an error, as determined by the FCS and adaptive parameter update logic 200, the most recently calculated channel parameters in register 146 are discarded in favor of the last known good parameters in register 148.

Control device 13 will continue to use the last known good coefficients from register 148 until the next transmission from a remote device 18, where the FCS and adaptive parameter update logic 200 will again perform the error calculation to determine whether to update equalizer 126 with the latest channel parameters from register 146.

The equalized signal is supplied through baud timing switch 127 to nonlinear decoder 128 which performs the inverse operation of nonlinear encoder 84. The output of nonlinear decoder 128 is supplied on line 129 to noise whitening filter 131. Noise whitening filter 131 is a part of the receiver precoder and includes a FIR filter and an adder. Noise whitening filter 131 performs the inverse operation of precoder 82 in order to provide the correct channel response to scaler 134. The output of noise whitening filter 131 is supplied on line 132 to scaler 134 which operates on the received signal with a 1/scale factor. The 1/scale factor is a function of the data rate depending on the number of points in the constellation. The output of scaler 134 is the normalized X and Y components representing the values of the symbols in the circular signal space constellation.

The normalized output of scaler 134 is supplied to slicer 138, which performs the inverse operation of mapper 54. Slicer 138 generates the nearest ideal reference vector $X_R$, $Y_R$ to the received X, Y vector. Because the signal is normalized, one slicer can be used for all data rates.

The input of scaler 134 is also supplied to subtractor 142 along with the upscaled output of slicer 138 through scaler 139. Scaler 139 upscales the output of slicer 138 for input to subtractor 142. Adder 142 subtracts the input to the 1/scale factor from the upscaled output of slicer 138 to obtain an error signal on line 144 to update FIR filter tap coefficients of equalizer 126. Improved precision is achieved using the input of scaler 138 and the upscaled references on line 141.

The output of slicer 138 is then supplied on line 149 to precoder reconstruction filter 152. Precoder reconstruction filter 152 removes the modulo operation applied in transmitter 22 of FIG. 3. The output of slicer 138 represents ideal reference signals of the X and Y values of the signal space constellation. These ideal values are input to subtractor 151, which subtracts the output of FIR filter 157. The output of subtractor 151 is fed into FIR filter 157 and adder 158. The output of FIR filter 157 feeds subtractor 151 and modulo operation 159. Modulo operation 159 is then added to the input to FIR filter 157 by adder 158 resulting in the removal of the modulo operation applied in transmitter 22 of FIG. 3.

Figure 4B:
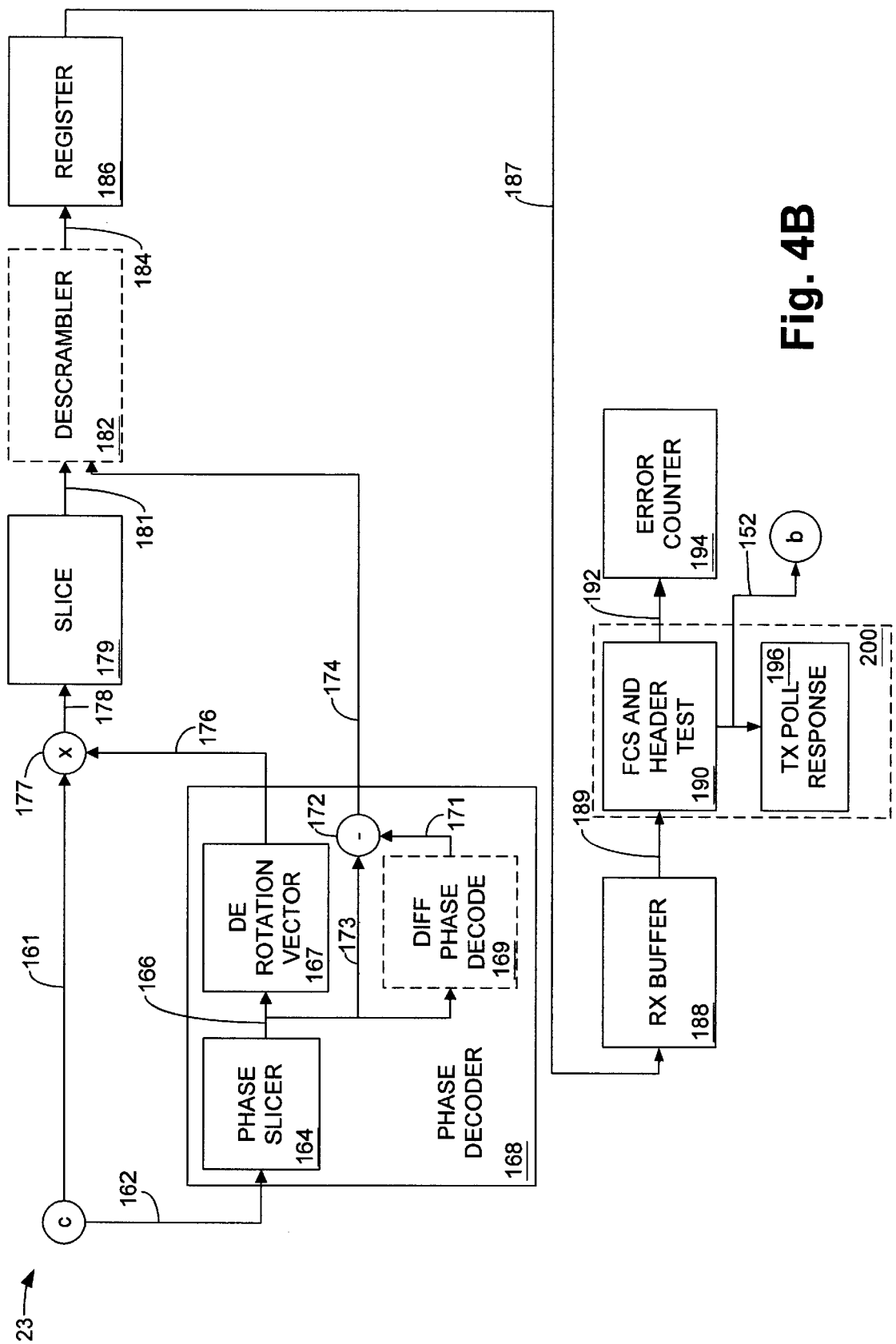

With reference now to FIG. 4B, phase decoder 168 decodes the 2 lsb's of the received signal by analyzing the output of precoder reconstruction filter 152 to determine which phase rotation was transmitted.

Phase slicer 164 slices the circular signal space constellation to separate the 2 lsb's for input on line 166 to derotation vector operator 167. Derotation vector operator 167 outputs a derotation vector on line 176 which is combined with the output of precoder reconstruction filter 152 on line 161 in rotator 177. Rotator 177 multiplies the X and Y values from precoder reconstruction filter 152 with the derotation vector from phase decoder 168 for input to slicer 179 on line 178. As in the transmitter, phase decoder 168 optionally includes differential decoder 169 to decode the 2 lsb's if they were differentially encoded in the transmitter.

Differential decoder 169 develops 2 differential bits on line 171 in order to recover the 2 lsb's of the N bit word. The 2 differential bits are subtracted in subtractor 172 from the output of phase slicer 164 on line 173 and input on line 174 to optional descrambler 182.

Differential decoder 169 eliminates the need for a trellis decoder, thus reducing processor cycles. In the absence of differential decoder 169, the 2 lsb's are passed through subtractor 172 on line 173 with nothing subtracted from them, essentially passing them directly to optional descrambler 182.

Slicer 179 converts the complex vector X, Y into the original N-2 msb's. Slicer 179 performs a mathematical operation in that it masks each axis to slice the axis. Slicer 179 then multiplies one of the axes of the constellation by a scale factor, and then adds the other masked axis value to the result. The output of slicer 179 is the N-2 msb data that was originally transmitted which is then combined with the decoded 2 least significant bits from phase decoder 168 to form the decoded N bit word.

If included, optional scrambler 182 descrambles the n bit word and supplies the word to register 186, which performs the inverse operation of register 46 in transmitter 22. The output of register 186 is supplied on line 187 to RX buffer 188, which in turn supplies the data word to frame check sequence and header test logic 190. FCS and header test logic 190, which is part of the frame check sequence and adaptive parameter update logic 200, performs the layer two error detection in the DSP on a per message basis by calculating the FCS on a per frame basis. The result of the FCS is used as an indication of whether or not to save the updated equalizer adaptive coefficients. If the FCS indicates an error free transmission, the updated coefficients are provided on line 152 to register 146 (FIG. 4A) and used to update the adaptive coefficients of equalizer 126. The data word is then supplied on line 192 to error counter 194, which provides a running error count.

Figure 5:
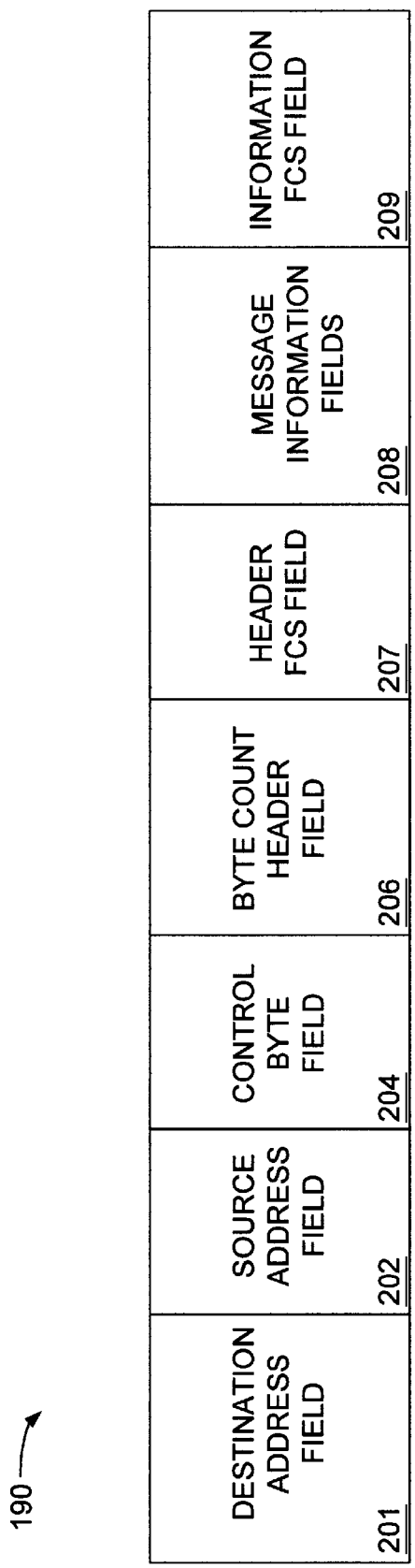
FIG. 5 is a schematic view illustrating the layer two framing and frame check sequence performed by the frame check sequence and adaptive parameter update logic of FIG. 2.

Referring now to FIG. 5, shown is a schematic view illustrating the layer two framing and frame check sequence 190 performed by the frame check sequence and adaptive parameter update logic 200 of FIG. 2.

Message frame 190 includes multiple fields that represent the layer two framing and frame check sequence operation occurring within the DSP 21 of FIG. 2, which has heretofore only occurred in OSI layer two as part of the data link protocol. By moving this framing and FCS calculation into the DSP (OSI layer 1) the DSP can use the layer two error detection results to more robustly determine whether to update adaptive parameters. Optionally, the mean squared error vector of the equalizer may also be used to provide additional accuracy in determining whether the recently received signal contains errors.

The protocol incorporates a High-Level Data Link Control (HDLC) type protocol. Field 201 contains the destination address field of the polled remote device. Field 202 contains the source address field. Field 204 contains the control byte. Field 204 encodes three types of frames. Information frames that carry user data, supervisory frames that carry physical layer messages, and management frames that carry management messages. Field 204 also encodes polling, flow control, and address management functions.

Field 206 contains the byte count header. Field 206 contains the number of bytes that are in the frame following the header. This count allows the DSP to know in advance when the frame being received is to end.

Field 207 contains the frame check sequence header, field 208 contains the message information, and field 209 contains the frame check sequence information.

Field 208 contains the payload. Frame 209 carries the user data. In management frames the information field carries management data or messages. In supervisory frames, the information field caries physical layer messages.

Operation

Figure 6:
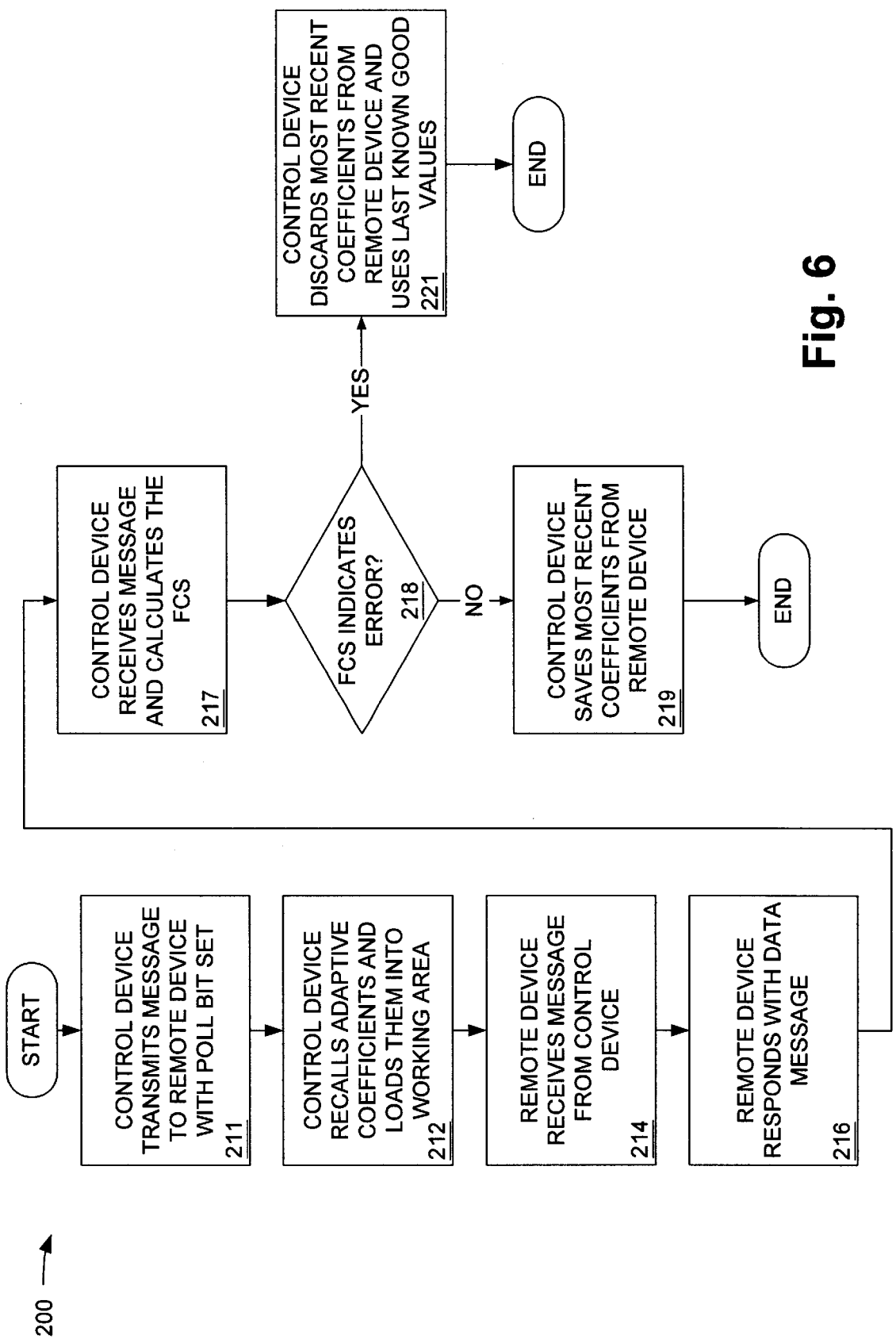
FIG. 6 is a flow chart illustrating the operation of the frame check sequence and adaptive parameter update logic of the communication device of FIG. 2.

Referring now to FIG. 6, shown is an operational flow chart 200 of the frame check sequence and adaptive parameter update logic 200 of the present invention.

The operation of the present invention occurs after a standard training procedure has been completed and the control device 13 and remote devices 18 have been transmitting and receiving data in normal operating mode. This procedure includes the control device training its adaptive devices, including its equalizer using coefficients calculated by the DSP, on channel parameters determined when messages are received from remote device 18.

The following description of the operation of the frame check sequence and adaptive parameter update logic 200 assumes that both control device 13 and remote devices 18 have previously established a communication link, gone silent, and wish to reestablish the communication link. Furthermore, while the following illustrates a single remote device communicating with a control device, the principles of the present invention contemplate a control device communicating with a plurality of remote devices on the communication channel.

In block 211 the control device transmits a message having the poll bit set to a remote device. Having the poll bit set alerts the remote device that the control device is inquiring whether the remote device has any information to transmit to the control device. In block 212 the control device, knowing which remote device is being polled, recalls the equalizer coefficients, and any other adaptive parameters for that particular remote device, and loads the coefficients into a working active receiver area (register 148 of FIG. 4A).

In block 214 the remote device receives the message having the poll bit set from the control device and, if it has any information to transmit, responds with a message.

In block 217 the message from the remote device is received by the control device. The control device receives the message and calculates the frame check sequence as described with respect to FIGS. 4B and 5. Simultaneously, the control device 13 is calculating new adaptive coefficients based upon this newly received message. The FCS calculation is performed by the DSP in the control device using the layer two error detection results, and optionally, in conjunction with the mean squared error vector, to determine whether to save the most recently calculated adaptive coefficients.

In block 218, the DSP in the control modem decides whether or not to save the latest channel parameters. If the frame check calculation performed in the DSP indicates that the latest transmission is error free, block 219 indicates that the control device will save the most recently calculated coefficients to a memory location, register is 148 of FIG. 4A associated with the particular remote device that complete the transmission, and continue the transmission session using the latest adaptive coefficients.

If the frame check calculation performed by the DSP indicates errors in the most recent transmission, block 221 indicates that the control device will discard the most recently received coefficients and will use the last known good coefficients, register 146 of FIG. 4A, for the particular remote device.

It will be obvious to those skilled in the art that many modifications and variations may be made to the preferred embodiments of the present invention, as set forth above, without departing substantially from the principles of the present invention. For example, but not limited to the following, it is possible to implement the present invention to update adaptive coefficients of an echo canceler, adaptive gain control, and timing loop updates. All such modifications and variations are intended to be included herein within the scope of the present invention, as defined in the claims that follow.

Therefore, the following is claimed:

1. A digital subscriber line (DSL) communication device, comprising:
   a receiver for developing a received signal; and
   a digital signal processor (DSP) configured to perform layer two error detection by computing a frame check sequence (FCS) on each frame of said received signal, wherein said layer two error detection resides in layer one of the OSI seven layer model.

2. The apparatus as defined in claim 1, wherein said DSL device operates in a multipoint environment.

3. The apparatus as defined in claim 1, wherein said DSL device operates in a half duplex environment.

4. The apparatus as defined in claim 1, wherein said DSL device operates in a full duplex environment.

5. The apparatus as defined in claim 1, wherein said DSL device operates in an asymmetrical duplex environment.

6. A method for updating adaptive parameters in a digital subscriber line (DSL) communication device, comprising the steps of:

developing, in a receiver, a received signal; and performing, in a digital signal processor (DSP), layer two error detection by computing a frame check sequence (FCS) on each frame of said received signal, wherein said step of performing layer two error detection occurs in layer one of the OSI seven layer model.

7. The method as defined in claim 6, wherein said DSL device operates in a multipoint environment.

8. The method as defined in claim 6, wherein said DSL device operates in a half duplex environment.

9. The method as defined in claim 6, wherein said DSL device operates in a full duplex environment.

10. The method as defined in claim 6, wherein said DSL device operates in an asymmetrical duplex environment.

11. The apparatus as defined in claim 1, wherein said frame check sequence is used to calculate the adaptive parameters of a device chosen from the group consisting of an equalizer, echo-canceller, adapter gain device, and timing loop.

12. The apparatus as defined in claim 1, wherein said frame check sequence is used to adapt a receive margin level based on said received signal.

13. The method as defined in claim 6, further comprising the step of using said frame check sequence to calculate the adaptive parameters of a device chosen from the group consisting of an equalizer, an echo-canceller, an adaptive gain device, and a timing loop.

14. The method as defined in claim 6, wherein said frame check sequence is used to adapt a receive margin level based on said received signal.

* * * * *